(12) United States Patent
Chiasson et al.

(10) Patent No.: US 9,430,011 B2
(45) Date of Patent: Aug. 30, 2016

(54) SYSTEMS AND METHODS FOR DETERMINING THE STATE OF HEALTH OF A CAPACITOR MODULE

(75) Inventors: Shane Chiasson, Pflugerville, TX (US); Anand Nunna, Round Rock, TX (US); David Rock, Round Rock, TX (US); Marcelo Saraiva, Austin, TX (US); William Lynn, Round Rock, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 1052 days.

(21) Appl. No.: 12/693,244

(22) Filed: Jan. 25, 2010

(65) Prior Publication Data

US 2011/0185211 A1 Jul. 28, 2011

(51) Int. Cl.
*G06F 1/30* (2006.01)
*G01R 31/02* (2006.01)

(52) U.S. Cl.
CPC .............. *G06F 1/30* (2013.01); *G01R 31/028* (2013.01)

(58) Field of Classification Search
USPC .......................................................... 714/22
See application file for complete search history.

(56) References Cited

U.S. PATENT DOCUMENTS

| 5,345,583 | A | * | 9/1994 | Davis .............................. 714/23 |
| 7,487,391 | B2 | * | 2/2009 | Pecone et al. .................. 714/14 |
| 7,661,002 | B2 | * | 2/2010 | Pecone et al. ................ 713/300 |
| 2006/0080515 | A1 | * | 4/2006 | Spiers et al. .................. 711/162 |
| 2007/0033431 | A1 | * | 2/2007 | Pecone et al. .................... 714/6 |
| 2007/0033432 | A1 | * | 2/2007 | Pecone et al. .................... 714/6 |
| 2007/0033433 | A1 | * | 2/2007 | Pecone et al. .................... 714/6 |
| 2007/0236225 | A1 | * | 10/2007 | Tsenter et al. ................ 324/426 |
| 2009/0072982 | A1 | * | 3/2009 | Cheng et al. ................. 340/635 |
| 2009/0128097 | A1 | * | 5/2009 | Esnard .......................... 320/137 |
| 2009/0167541 | A1 | * | 7/2009 | Dooley et al. ................ 340/635 |
| 2010/0202240 | A1 | * | 8/2010 | Moshayedi et al. .......... 365/229 |

OTHER PUBLICATIONS

Delmar's Standard Textbook of Electricity, Fourth Edition, Cengage Learning, Inc Copyright 2009, Stephen L. Herman.*

* cited by examiner

*Primary Examiner* — Kamini Patel
(74) *Attorney, Agent, or Firm* — Baker Botts L.L.P.

(57) ABSTRACT

Systems and methods for determining the state of health for a capacitor module are provided. In some embodiments, a method for monitoring the health of a capacitor module comprising an array of capacitors is provided. The method may include steps for disabling a charger coupled to an array of capacitors of the capacitor module, determining if the capacitor module is healthy based at least on operating values of the capacitor module, and enabling a write back mode for the memory module if the capacitor module is determined to be healthy.

17 Claims, 2 Drawing Sheets

SYSTEMS AND METHODS FOR DETERMINING THE STATE OF HEALTH OF A CAPACITOR MODULE

TECHNICAL FIELD

The present disclosure relates to memory, and more particularly, system and methods for determining the state of health for a capacitor module associated with a memory module.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as, but not limited to, financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often use an array of storage devices, for example, a Redundant Array of Independent Disks (RAID) to store information. Arrays of storage devices typically utilize multiple disks to perform input and output operations and can be structured to provide redundancy that may increase fault tolerance. Storage device arrays may be implemented using a number of techniques to provide redundancy, including striping, mirroring, and/or parity checking. For example, as known in the art, RAIDs may be implemented according to numerous RAID standards, including without limitation, RAID 0, RAID 1, RAID 0+1, RAID 3, RAID 4, RAID 5, RAID 6, RAID 01, RAID 03, RAID 10, RAID 30, RAID 50, RAID 51, RAID 53, RAID 60, RAID 100, etc.

Current systems use a battery-backed device that provides backup power in the event power to the information handling system is disrupted. For example, battery-backed storage devices are used to allow for the transfer of data from a volatile storage device to a non-volatile storage device. However, there are several problems with using battery back storage devices including reliability, shelf-life, and data integrity, especially data stored in volatile memory is often hampered with the use of batteries.

SUMMARY

In accordance with the teachings of the present disclosure, the disadvantages and problems associated with battery-backed storage devices have been reduced or eliminated. In certain embodiment of the present disclosure, an information handling system including a processor, a memory module coupled to the processor, a capacitor module associated with the memory module, and a controller coupled to the capacitor module is provided. The controller may be configured to disable the charger coupled to the array of capacitors, determine if the capacitor module is healthy based at least on operating values of the capacitor module; and enable a write back mode for the memory module if the capacitor module is determined to be healthy.

In other embodiments, an apparatus including a controller for determining the health of a capacitor module associated with a memory module is provided. The controller may be configured to disable a charger coupled to an array of capacitors of the capacitor module, determine if the capacitor module is healthy based at least on operating values of the capacitor module, and enable a write back mode for the memory module if the capacitor module is determined to be healthy.

In some embodiments, a method for monitoring the health of a capacitor module comprising an array of capacitors is provided. The method may include steps for disabling a charger coupled to an array of capacitors of the capacitor module, determining if the capacitor module is healthy based at least on operating values of the capacitor module, and enabling a write back mode for the memory module if the capacitor module is determined to be healthy.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
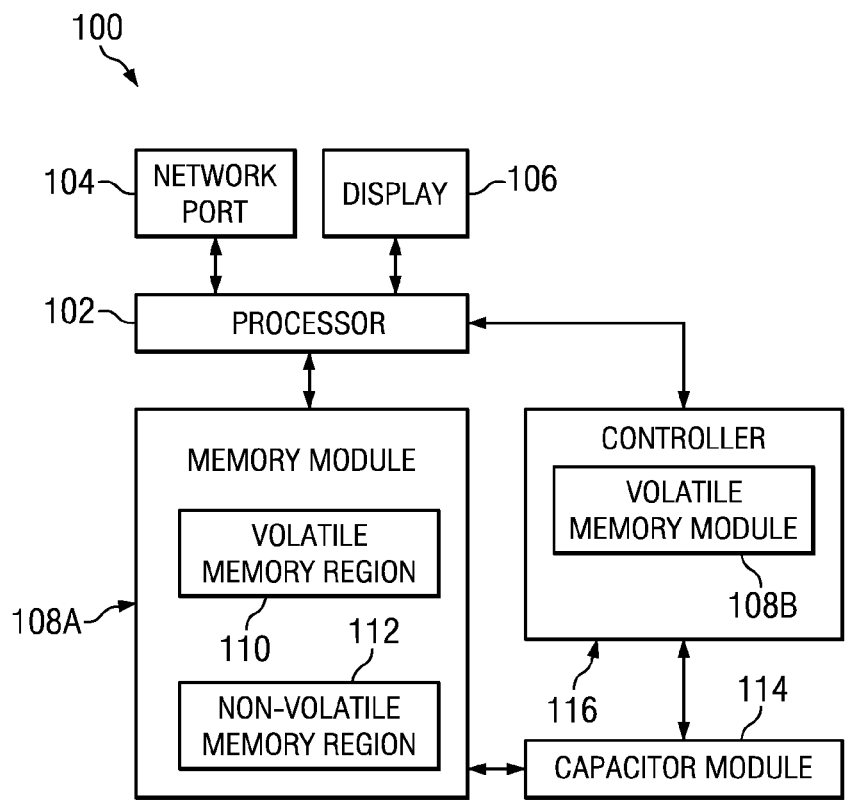
FIG. 1 illustrates a block diagram of an example information handling system including a controller configured to monitor the health of a capacitor module used to provide power in the event of an unexpected shutdown of power to the system, in accordance with certain embodiments of the present disclosure.
Figure 2:
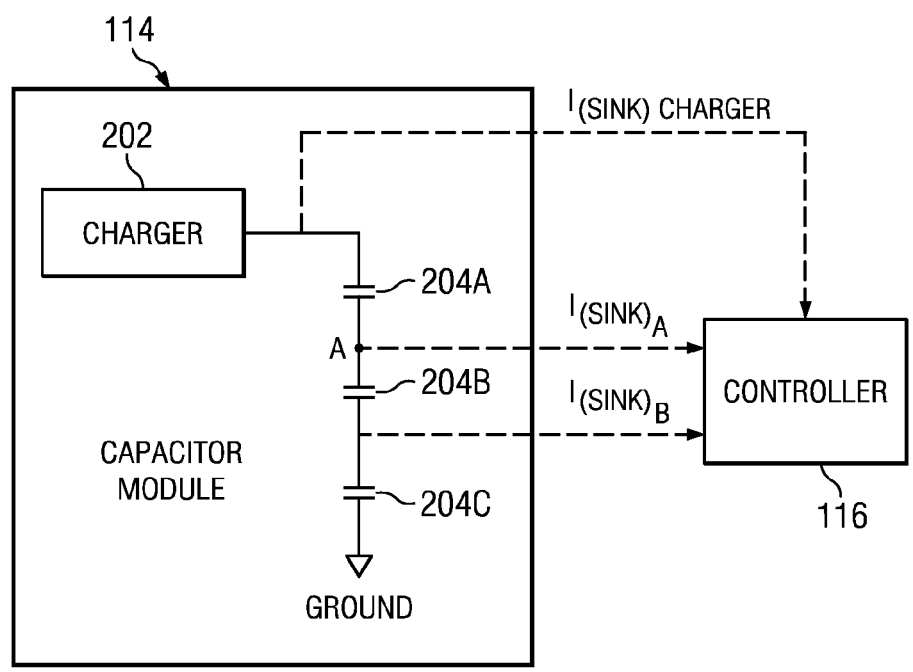
FIG. 2 illustrates a block diagram of an example capacitor module, in accordance with certain embodiments of present disclosure.
Figure 3:
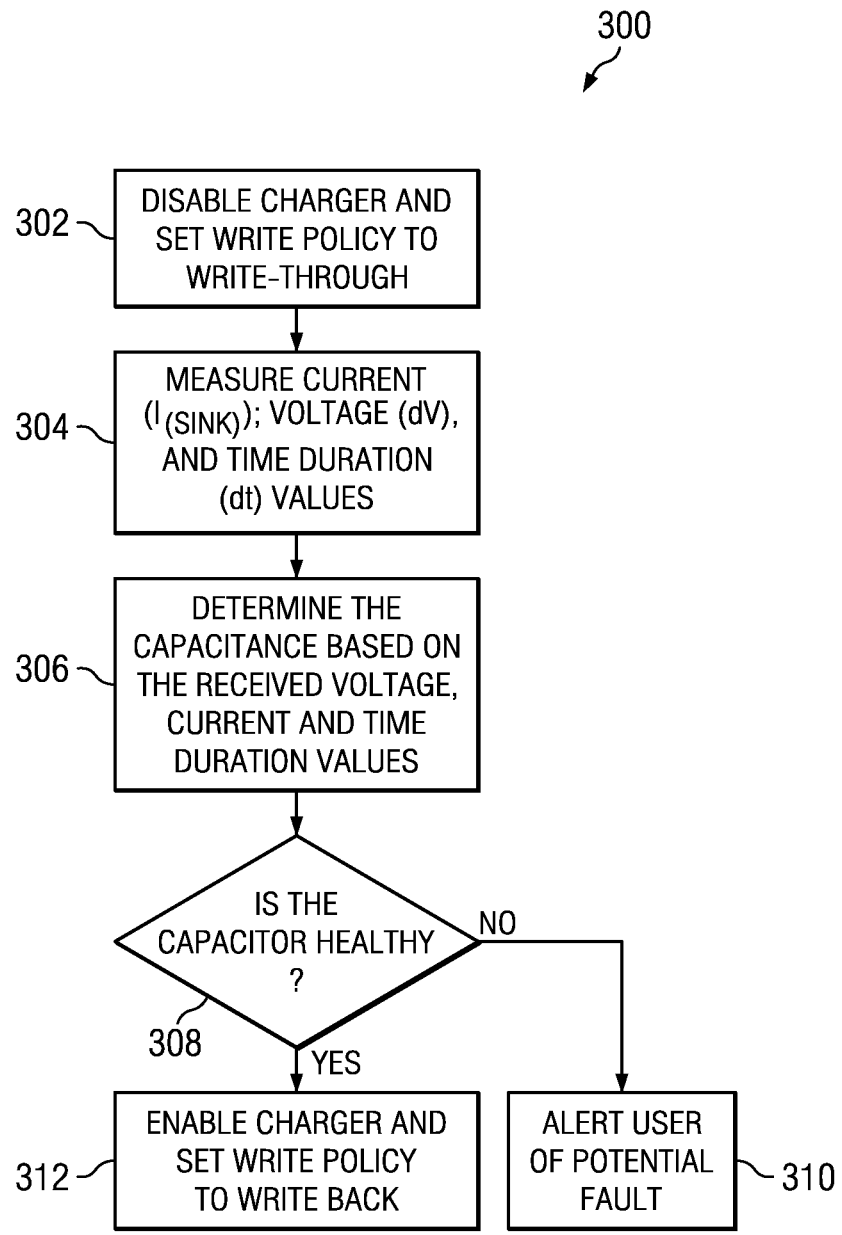
FIG. 3 illustrates an example flowchart of a method for determining the state of health of a capacitor module, in accordance with certain embodiments of the present disclosure.

Preferred embodiments and their advantages are best understood by reference to FIGS. 1-3, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of non-volatile memory. Additional components of the information handling system may include one or more disk drives, one or more network ports for communicating with external devices as well as various input and output (I/O) devices, such as a keyboard, a mouse, and/or a video display. The information handling system may also include one or more buses operable to transmit communications between the various hardware components.

FIG. 1 illustrates a block diagram of an example information handling system 100 including a controller configured to monitor the health of a capacitor module used to provide power in the event of an unexpected shutdown of power to system 100, in accordance with certain embodiments of the present disclosure. As shown in FIG. 1, information handling system 100 may include a processor 102, a network port 104, a display 106, memory modules 108, capacitor module 114, and controller 116.

Processor 102 may comprise any system, device, or apparatus operable to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 102 may interpret and/or execute program instructions and/or process data stored in memory module(s) 108 and/or another component of information handling system 100 and may output results, graphical user interfaces (GUIs), websites, and the like via display 106 or over network port 104.

Network port 104 may be any suitable system, apparatus, or device operable to serve as an interface between information handling system 100 and a network. Network port 104 may enable information handling system 100 to communicate over a network using any suitable transmission protocol and/or standard, including without limitation all transmission protocols and/or standards known in the art.

Display 106 may comprise any display device suitable for creating graphic images and/or alphanumeric characters recognizable to a user, and may include, for example, a liquid crystal display (LCD) or a cathode ray tube (CRT).

Memory module 108A may be coupled to processor 102 and memory module 108B may be coupled to controller 116, each memory module 108 may include any system, device, or apparatus operable to retain program instructions or data for a period of time. In some embodiments, each memory module 108 may be a dual inline memory module (DIMM). Each memory module 108 may include a volatile memory region 110 and a non-volatile memory region 112, each configured to retain data and/or program instructions. Volatile memory region 110 may include any system, device, or apparatus configured to temporarily store data and/or program instructions. In some embodiments, volatile memory region 110 may include random access memory (RAM) or other similar volatile memory device that maximize throughput. The data and/or program instructions stored in volatile memory region 110 may subsequently be transferred to non-volatile memory region 112, e.g., upon detection of a power failure or interruption. Non-volatile memory region 112 may include any system, device, or apparatus configured to store data and or instructions. In some embodiments, non-volatile memory region 112 may be flash memory or any suitable non-volatile memory configured to retain data after power to information handling system 100 is turned off.

Capacitor module 114 coupled to memory modules 108A and/or 108B may include any system, device, and/or apparatus operable to supply power directly to memory module 108A and/or 108B when power supplied to system 100 is interrupted or fails, thereby preserving the integrity of the data stored in memory modules 108, e.g., volatile memory region 110. In some embodiments, capacitor module 114 may include a super capacitor or an array of super capacitors. Details of capacitor module 114 will be discussed below with respect to FIG. 2.

Controller 116 may be communicatively coupled to processor 102, memory module 108B, and/or capacitor module 114 and may include any hardware, software, and/or firmware configured to control the data transfer between volatile memory region 110 and non-volatile memory region 112. In some embodiments, controller 116 may monitor capacitor module 114 to determine the health of the capacitor module. In some embodiments, the health of the capacitor module may be determined by checking if the capacitor module 114 can operate with a predetermined specification such that the transfer between volatile memory region 110 and non-volatile memory region 112 can be completed during a power outage. Details of determining the health of capacitor module 114 are discussed below with respect to FIG. 2.

FIG. 2 illustrates a block diagram of an example capacitor module, in accordance with certain embodiments of present disclosure. As depicted, capacitor module 114 includes a charger 202 configured to charge the capacitors 204 of capacitor module 114 and an array of three super capacitors, 204A, 204B, and 204C. It is noted that capacitor module 114 may include any number of capacitors arranged in any matter, e.g., an array of capacitors coupled in series, an array of capacitors coupled in parallel, a single capacitor coupled to charger 202, etc.

In order to determine the health of capacitors 204, controller 116 may first disable charger 202 and monitor the voltage, current, and time duration for each capacitor. For example, referring to FIG. 2, controller 116 may disable charger 202 and at node A, measure the voltage (dV), current ($I_{(sink)A}$), and the time duration (dt) of capacitor 204A. Based at least on the voltage, current, and time measurements, controller 116 may determine the capacitance of capacitor 204A. Controller 116 may also determine the health of the other capacitors of capacitor module 114. If controller 116 determines the health of capacitor module 114 is acceptable, e.g., capacitor module 114 is able to power memory module 108 during a power failure, controller 116 may enable a write-back mode allowing system 100 to operate with a faster throughput. In a write back mode, controller 116 may assume ownership of the data and/or the program instructions received from a sender. Rather than immediately storing the data onto a storage device e.g., non-volatile memory region 112, controller 116 may store the data in a write cache, e.g., volatile memory region 110 and signal to the sender that the data has been successfully stored. Then, when it is convenient, the data in the write cache may be flushed to the storage device, where it becomes "permanently" stored. However, until the write cache data is actually stored in the storage device, it remains "dirty." The term "dirty" indicates that data stored in the write cache has yet to be stored in a storage device. Since cache memories are often volatile memories that need electric power in order to store data, this data is vulnerable to being permanently lost if there is a power outage or other power event (e.g., sleep mode and/or standby). Thus, the monitoring and determining of the state of health of capacitor module 114 may ensure that the data and/or instructions not permanently stored is transferred in full, especially in the event of a power failure or power interruption.

If controller 116 determines that capacitor module 114 is not healthy, controller may enable a write-through mode ensuring that all data is stored in the intended storage device. For example, in a write-through mode, data or program instructions sent from a sender (e.g., processor 102, host, etc.) are received at controller 116 and controller 116 may pass the information directly to the intended storage device, e.g., non-volatile memory region 112. The storage device may store the received data and may send an acknowledgment back to controller 116, which forwards the acknowledgment to the sender.

In some embodiments, controller 116 may also balance the load across capacitors 204. For example, after disabling charger 202, and upon determining that a capacitor 204 is overcharged or undercharged, controller 116 may be configured to sink current from an overcharged capacitor 204 or charge an undercharged capacitor 204 until the capacitor is balanced with the other capacitors of capacitor module 114. In some embodiments, controller 116 may toggle the charge across capacitors 204 so the capacitance load is balanced.

FIG. 3 illustrates an example flowchart of a method 300 for determining the health of capacitors 204 in capacitor module 114, in accordance with certain embodiments of the present disclosure. In one embodiment, at step 302, controller 116 may disable charger 202 of capacitor module 114. Controller 116 may also set system 100 to a write-through mode, which ensures that data and/or program instructions are written to the intended storage device and that no data is lost in the event a power disruption or failure occurs while controller 116 is determining the health of capacitor module 114.

At step 304, for each capacitor 204 of capacitor module 114, controller 116 may measure the operating values of capacitance module, e.g., current ($I_{sink}$), the voltage (dV) and/or the time duration (dt). At step 306, controller 116 may determine the capacitance of each capacitor 204 based on the measured values.

At step 308, if capacitors 204 are not healthy, e.g., if capacitors 204 are unable to power memory module(s) 108 for the entire transfer of data and/or program instructions from volatile memory region 110 to non-volatile memory region 112, method 300 may proceed to step 310. If capacitors 204 are healthy, e.g., capacitors 204 are able to power memory module 108 for the entire data and/or program instruction transfer between volatile memory region 110 and non-volatile memory region 112, method 300 may proceed to step 312.

At step 310, controller 116 may provide an alert to a user, e.g., via a graphical user interface displayed on display 106, informing the user of the power failure of the back-up power device, e.g., capacitor module 114 in the event of an interruption or failure of power to information handling system 100. Controller 116 may also maintain system 100 in a write-through mode to ensure that data and/or program instructions are written to the intended storage and are not lost during a power failure or interruption.

At step 312, after determining capacitors 204 are healthy and able to charge capacitor module 114 during a data and/or program instruction transfer, controller 116 may enable charger 202 and may switch system 100 to a write-back mode for increased throughput in system 100.

Steps 302-312 may be repeated periodically, e.g., a set time interval, or may be continuously repeated to monitor the health of capacitors 204 of capacitor module 114. It is noted that method 300 may be implemented with fewer steps or the steps may be performed in a different order.

The present disclosure provides, for example, the monitoring of a capacitor module to ensure data transfers between a volatile memory region 110 and a non-volatile memory 112 are completed in the event a power failure or a power interruption occurs.

Although the present disclosure has been described in detail, it should be understood that various changes, substitutions, and alterations can be made hereto without departing from the spirit and the scope of the invention as defined by the appended claims.

What is claimed is:

1. An information handling system, comprising:
   a processor;
   a memory module coupled to the processor;
   a capacitor module associated with the memory module, the capacitor module comprising an array of capacitors coupled to a charger; and
   a controller coupled to the capacitor module, the controller configured to:
      disable the charger coupled to the array of capacitors;
      after disabling the charger:
         enable a write through mode for the memory module;
         determine if the capacitor module is healthy based at least on monitored operating values of the capacitor module before the capacitor module is fully discharged, the monitored operating values including a time duration for each capacitor in the array of capacitors;
      maintain the write through mode for the memory module if the capacitor module is determined to not be healthy; and
      enable a write back mode for the memory module if the capacitor module is determined to be healthy.

2. An information handling system according to claim 1, wherein the array of capacitors comprises an array of super capacitors.

3. An information handling system according to claim 1, wherein the monitored operating values further comprise at least one of a voltage value, a current value, and a capacitance value for each capacitor of the capacitor module.

4. An information handling system according to claim 1, wherein the capacitor module is configured to power the memory module during a power failure.

5. An information handling system according to claim 1, wherein if the capacitor module is not healthy, the controller is further configured to provide an alert to a user indicating the power fault.

6. An apparatus, comprising:
   a controller for determining the health of a capacitor module associated with a memory module, the controller configured to:
      disable a charger coupled to an array of capacitors of the capacitor module;
      after disabling the charger:
         enable a write through mode for the memory module;
         determine if the capacitor module is healthy based at least on monitored operating values of the capacitor module before the capacitor module is fully discharged, the monitored operating values including a time duration for each capacitor in the array of capacitors;
      maintain the write through mode for the memory module if the capacitor module is determined to not be healthy; and enable a write back mode for the memory module if the capacitor module is determined to be healthy.

7. An apparatus according to claim 6, wherein the array of capacitors comprises an array of super capacitors.

8. An apparatus according to claim 6, wherein the monitored operating values further comprise at least one of a voltage value, a current value, and a capacitance value for each capacitor of the capacitor module.

9. An apparatus according to claim 6, wherein the capacitor module is configured to power the memory module during a power failure.

10. An apparatus according to claim 6, wherein if the capacitor module is not healthy, the controller is further configured to provide an alert to a user indicating the power fault.

11. An apparatus according to claim 6, wherein the controller is further configured to determine if a capacitor of the capacitor array is overcharged or undercharged.

12. An apparatus according to claim 11, wherein the controller is further configured to sink current from an overcharged capacitor or charge an undercharged capacitor to achieve a load balance across the capacitor array.

13. A method for monitoring the health of a capacitor module comprising an array of capacitors, the method comprising:
  disabling a charger coupled to an array of capacitors of the capacitor module;
  after disabling the charger:
    enabling a write through mode for the memory module;
    determining if the capacitor module is healthy based at least on monitored operating values of the capacitor module before the capacitor module is fully discharged, the monitored operating values including a time duration for each capacitor in the array of capacitors;
  maintaining the write through mode for the memory module if the capacitor module is determined to not be healthy; and
  enabling a write back mode for the memory module if the capacitor module is determined to be healthy.

14. A method according to claim 13, wherein the array of capacitors comprises an array of super capacitors.

15. A method according to claim 13, wherein the monitored operating values further comprises at least one of a voltage value, a current value, and a capacitance value for each capacitor of the capacitor module.

16. A method according to claim 13, wherein the capacitor module is configured to power the memory module during a power failure.

17. A method according to claim 13, wherein if the capacitor module is not healthy, the method further comprises providing an alert to a user indicating the power fault.

* * * * *